United States Patent
Adkisson et al.

[11] Patent Number: 6,030,541
[45] Date of Patent: Feb. 29, 2000

[54] PROCESS FOR DEFINING A PATTERN USING AN ANTI-REFLECTIVE COATING AND STRUCTURE THEREFOR

[75] Inventors: James W. Adkisson; Michael Caterer, both of Jericho, Vt.; James T. Marsh, Poughkeepsie, N.Y.; Hung Ng, New Milford, N.J.; James M. Oberschmidt, Stanfordville, N.Y.; Jed H. Rankin, Burlington, Vt.

[73] Assignee: International Business Machines Corporation, Armonk, N.Y.

[21] Appl. No.: 09/100,542

[22] Filed: Jun. 19, 1998

[51] Int. Cl.[7] .................................................. H01L 21/033
[52] U.S. Cl. ................................. 216/51; 216/40; 438/717
[58] Field of Search ................................. 216/41, 49, 50, 216/51; 438/717

[56] References Cited

U.S. PATENT DOCUMENTS 5,741,741  4/1998  Tseng ......................................... 438/637
5,858,621  1/1999  Yu et al. ..................................... 430/313
5,883,011  3/1999  Lin et al. .................................... 438/747
5,891,784  4/1999  Cheung et al. ........................... 438/303

*Primary Examiner*—Bruce Breneman
*Assistant Examiner*—Alva C Powell
*Attorney, Agent, or Firm*—Pollock, Vande Sande & Amernick; William D. Sabo

[57] ABSTRACT

A pattern in a surface is defined by providing on the surface a hard mask material; depositing an anti-reflective coating on the hard mask material; applying a photoresist layer on the anti-reflective coating; patterning the photoresist layer, anti-reflective layer and hard mask material; and removing the remaining portions of the photoresist layer and anti-reflective layer; and then patterning the substrate using the hard mask as the mask. Also provided is a structure for defining a pattern in a surface which comprises a surface having a hard mask material thereon; an anti-reflective coating located on the hard mask material; and a photoresist located on the anti-reflective coating. Also provided is an etchant composition for removing the hard mask material which comprises an aqueous composition of HF and chlorine.

18 Claims, 5 Drawing Sheets

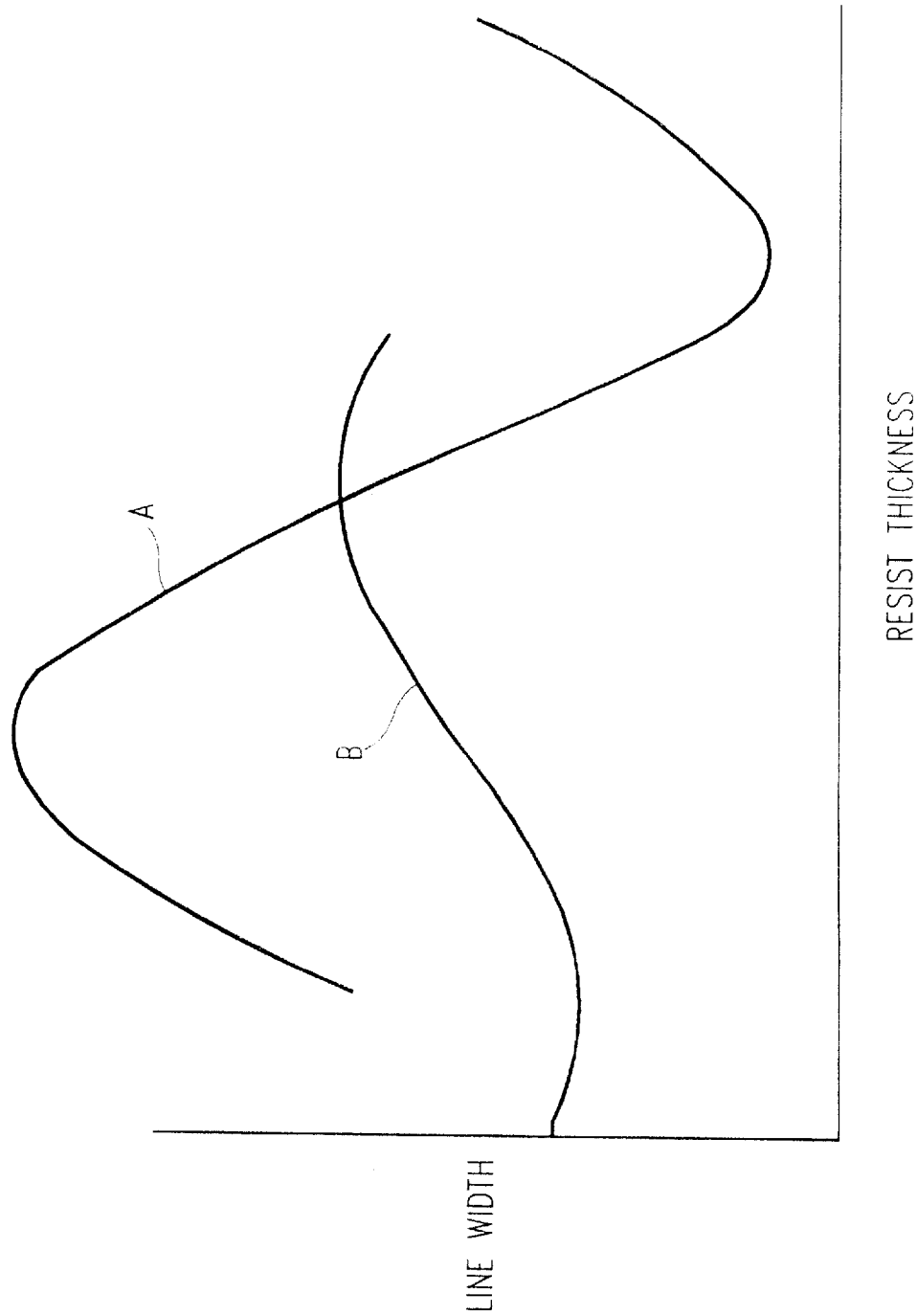

PROCESS FOR DEFINING A PATTERN USING AN ANTI-REFLECTIVE COATING AND STRUCTURE THEREFOR

TECHNICAL FIELD

The present invention is concerned with a process for defining a pattern in a surface and especially concerned with employing an anti-reflective coating. Furthermore, the present invention is concerned with a structure suitable for defining a pattern in a substrate wherein the structure includes an anti-reflective coating.

BACKGROUND OF INVENTION

Microelectronic devices used in fabricating integrated circuits are manufactured by employing photolithographic techniques. Fabricating various structures, particularly electronic device structures, typically involves depositing at least one layer of a photosensitive material, generally known as a photoresist material, on a substrate. The photoresist material may then be patterned by exposing it to radiation of a certain wavelength to alter characteristics of the photoresist material. In many instances, the radiation is from ultraviolet range of wavelengths causing desired photochemical reactions to occur within the photoresist. The photochemical reactions typically change the solubility characteristics of the photoresist, thereby permitting removal of certain selected portions of the photoresist while maintaining the other portions on the substrate. The selective removal of certain parts of the photoresist allows for protection of certain areas of the substrate while exposing other areas. The portions of the photoresist that remain on the substrate are used as a mask or stencil for processing the underlying substrate.

As methods for producing miniature electronic structures improve, the desire to produce even smaller structures has continued to increase. Problems encountered in further device miniaturization include obtaining desired resolution in the radiation source and improved focusing resolution and depth of focus of the radiation on the photoresist. Other problems encountered include radiation leakage through the mask. Radiation leakage has been addressed by ensuring that the radiation to which the mask and photoresist are exposed is well within the deep UV range and, in particular, less than 245 nanometers in wavelength. Additionally, the problem of long exposure time exists to increase the penetration of the UV radiation through planarization layers. Further problems include the ability of the patterns formed in the resist to withstand high power dry processes without the loss of the image integrity.

Progress in processes for forming structures and photoresists has led to the creation of sub-micron and even sub-half-micron structures. For instance, structures as small as 0.25 micron have been created. However, a common problem encountered as structure size has decreased is that thinner layers of photoresist must be used to ensure, among other things, that depth of focus requirements of the exposure tool are met. Also, thinner layers are preferable for high resolution imaging. The exposure tool refers to the radiation source, optics, mask and other components used to expose the photoresist. The photoresist used, especially at such lesser thicknesses, are highly transmissive of ultraviolet wavelengths used. The transmissivity of the photoresist coupled with the high reflectivity of the UV wavelengths of commonly used substrates results in the reflection of the UV radiation back into the photoresist, resulting in further photochemical reactions taking place in the photoresist. The further photochemical reactions resulting from the UV radiation reflected off of the surface typically result in uneven exposure of the photoresist.

As the light is reflected off of the substrate, standing waves may be created. As a result, the structure which was intended to be created by the mask will not be created, as particularly evidenced by inconsistent feature dimensions. This results in device error and possibly failure.

In order to address the transmissivity and reflectivity problems, anti-reflective coatings have been developed which are applied to substrates prior to applying the photoresist. As the photoresist is exposed to UV radiation, when the anti-reflective coating or ARC is an inorganic material it bounces back any light at about a ¼ wavelength offset, thereby resulting in wave cancellation. In the case of an organic anti-reflective coating, such typically absorbs light thereby minimizing reflection. The ARC greatly reduces the impact of highly reflective substrate surfaces as well as the impact of grainy substrate surfaces and topographical features on the substrate surface during deep UV imaging. Both inorganic and organic ARC films have been used. Typical inorganic films are silicon nitride, silicon oxynitride and titanium nitride. Although ARC has been quite useful to alleviate problems associated with reflectivity of substrate surfaces, problems still exist as structures become smaller and smaller, and especially when dealing with substrates that have a non-planar topography. For instance, when dealing with structures having shallow trench isolation (STI) and for instance less than 0.25 micron polysilicon gate dimension, a tendency exists for the thickness of the photoresist and anti-reflective coating to vary which in turn can result in the line width of the polysilicon varying due to thin film interference effects. Thin film interference effects cause necking of polysilicon lines and up to about 50 nanometers polysilicon line width variation. For instance, as schematically illustrated in FIG. 1, recesses or protrusions of underlying STI structure (10), can cause resist (18) and ARC (16) thickness variations at corners due to the recess STI, as well as local and global variations in resist and arc thickness.

Photoresist systems and inorganic anti-reflective coatings are tuned to perform optimally on a quarter wavelength reflectivity; therefore, thickness variation of either or both causes variation in the dimensions of the printed feature. More recently developed anti-reflective coatings exhibiting reduced swing curves have been developed for achieving improved line width control; however, resist thickness and ARC variations remain problematic.

In fact, current processes used for defining more conventional polysilicon gate dimensions are not extendable to technologies desiring dimensions of 0.25 microns and below. For instance, a current process used for polysilicon gate definition involves using a silicon oxinitride CVD ARC (16) conformably coated over polysilicon layer (12) (see FIG. 2A). Photoresist 18 is coated over the ARC layer (16). The photoresist layer (18) is patterned and remains in place while the underlying SiON (16) and polysilicon (12) are defined such as using reactive ion etching (RIE) (see FIG. 2B). The photoresist 18 and SiON (16) are then stripped such as using RIE and/or wet $H_2PO_4$ etching composition (see FIG. 2C). However, the stripping procedures for removing the photoresist 18 and SiON 16 exhibit a tendency to cause device performance problems because of exposure of the polysilicon gates, STI, gate oxides and diffusions and ARC strip processes. Also, having the resist present during etching of the polysilicon can cause less of selectivity to oxide, which is especially significant on gate oxides of less than 40 Å.

SUMMARY OF INVENTION

The present invention provides a process for defining a pattern in a surface. The process of the present invention comprises providing on the surface a layer of a hard mask material and then depositing an anti-reflective coating on the layer of hard mask material. A photoresist layer is then applied on the anti-reflective coating. The photoresist layer, anti-reflective layer and layer of hard mask material are patterned. The remaining portion of the photoresist layer and anti-reflective layer are removed. The surface is then patterned using the hard mask as a mask to provide the desired pattern in the surface.

In addition, the present invention is concerned with a structure for defining a pattern in a surface. The structure comprises a surface having a layer of hard mask material thereon; an anti-reflective coating located on the layer of hard mask material; and a photoresist located on the anti-reflective coating.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

FIG. 6 is a resist swing curve comparing using an inorganic ARC to an organic ARC.

BEST AND VARIOUS MODES FOR CARRYING OUT INVENTION

Figure 1:
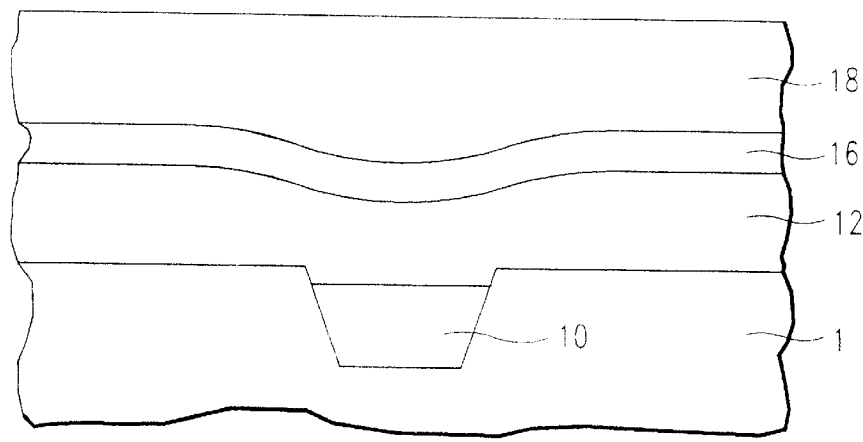
FIG. 1 illustrates a prior art structure for defining a pattern in a surface.

The present invention provides for defining a pattern in a surface. Although the present invention may be used to define a pattern in a variety of surfaces, the present invention is especially suitable for defining a pattern in a semiconductor substrate and especially a substrate having a non-planar topology. In order to facilitate an understanding of the present invention, reference will be made to the figures which illustrate a diagrammatic representation of the steps of carrying out the process of the present invention. According to the present invention, a layer 12 of a hard mask material is provided on a semiconductor substrate 1. The semiconductor substrate is typically silicon but can be any other semiconductor material such as group III-V semiconductor. The term "hard mask" material as known in the prior art refers to an inorganic masking material. The layer of hard mask material is preferably silicon dioxide obtained from tetraethyloxysilane (TEOS). The TEOS is deposited by chemical vapor deposition (CVD) or plasma-enhanced CVD to a thickness of about 100 to about 1000 Å, and more typically about 400 to about 600 Å. The TEOS is reacted with oxygen or ozone to provide the silicon oxide hard mask material. Other less preferred hard mask materials include phosphosilicate glass (PSG), borophosphosilicate glass (BPSI), silicon oxynitride and thermally grown silicon dioxide.

The anti-reflective coating 16 is then deposited on the layer of hard mask material 14. The anti-reflective coating is preferably an inorganic material that can be conformably deposited and most preferably is silicon oxynitride that is deposited by chemical vapor deposition. Other anti-reflective coatings that can also be deposited by chemical vapor depositions are silicon nitride, silicon, carbide, diamond-like carbon, and amorphous silicon. Also sputtered silicon can be used. $SiO_xN_y$ layer is preferably deposited by a PECVD technique wherein the source for the silicon is $SiH_4$, and the source for the oxygen and nitrogen is $N_2O$. The typical carrier gas is $N_2$ or He. A typical process comprises employing a mixture of about 50–200 sccm of Si $H_4$ and 100–500 sccm of $N_2O$ at temperature of about 350 to about 400° C. and pressures of about 2 to 10 torr. The anti-reflective coating is typically about 100 to about 2000 521 thick and more typically about 300 to about 600 Å thick.

By varying the conditions of the CVD process, the optical properties of the ARC can be modified for different exposure wavelengths. Persons skilled in the art once aware of this disclosure could determine desired conditions without undue experimentation.

In the event that the photoresist 18 to be subsequently applied is a chemically amplified photoresist, it may be desirable to oxidize the top surface of the silicon oxynitride layer 16 in order to prevent poisoning or acidification from the photoresist from occurring. This oxidation can be carried out by a plasma treatment in the presence of $N_2O$. In the alternative, instead of oxidizing the top surface of layer 16, another oxide layer can be deposited. Typically the oxide layer is about 50 to about 100 Å thick.

A layer of a photoresist material 18 is then deposited on the anti-reflective coating. A wide variety of photoresist materials can be employed in the process of the present invention. The photoresist materials include positive photoresists which are cross-linkable when exposed to UV radiation of up to 320 nm, or to i-line radiation particularly any suitable deep UV photoresist or i-line photoresist may be used, including all chemically amplified photoresists. Examples of positive photoresists that may be employed with the present invention include P-hydroxy styrene base DUV photoresist materials such as Apex available from Shipley. Any of the series of APX photoresists may be used. Also, those photoresists sensitized with diazo compounds may be employed.

Other photoresist materials that may be employed include the phenolic-formaldehyde type novolak polymer sensitized with a diazo compound. The phenols include phenol and substituted phenols such as cresol. Such are positive resist compositions and include therein a diazo ketone, such as 2-diazo-1-naphthol-5-sulphonic acid ester. Other photoresists include TBOC (tert-butyl-oxycarbonyloxystyrene), poly-t-butyl methacrylate, poly-t-butyl acrylate, polyphthalaldehyde and alkyl-substituted poly(vinyl phenol) materials.

The photoresist may be applied according to methods known to those skilled in the art such as spinning or spraying. The thickness of the photoresist layer may vary, depending upon the application. Typically the photoresist layer may be from about 3000 Å to about 15000 Å thick.

After the photoresist is applied to the substrate over the top of the anti-reflective coating, the photoresist is selectively imagewise exposed to a radiation source. The radiation may be of any wavelength, whether in the range of visible light or not. Preferably the radiation is in the ultraviolet range or i-line spectrum, and most typically in the deep UV range.

The pattern in the photoresist typically is formed by placing a mask over the photoresist. The mask is opaque to the wavelengths of radiation used. Such masks are known to those skilled in the art. Other means for selectively exposing the photoresist to radiation may also be used.

Figure 2A:
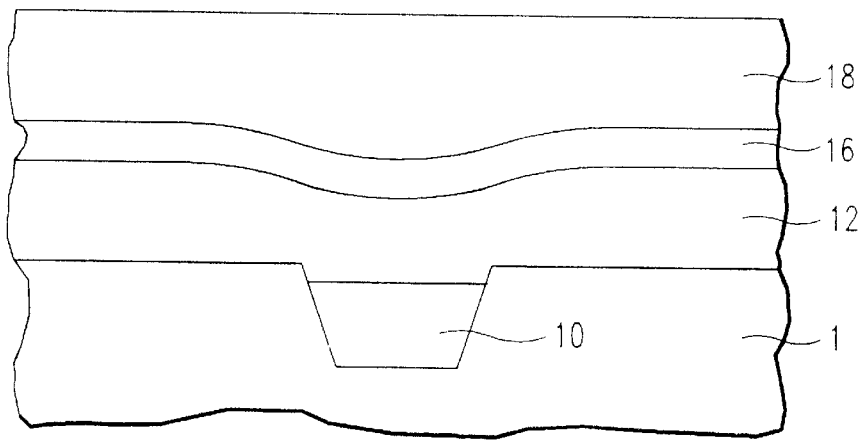
FIGS. 2A–2C illustrate a prior art sequence for defining a pattern in a surface.
Figure 2B:
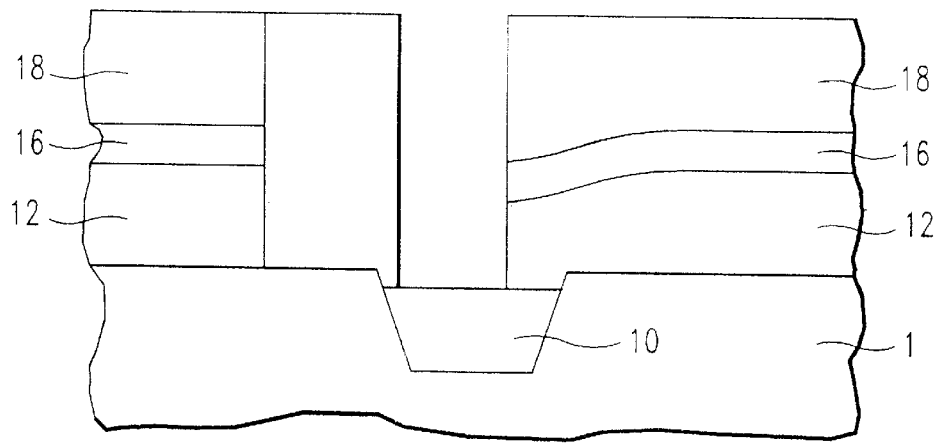
Figure 2C:
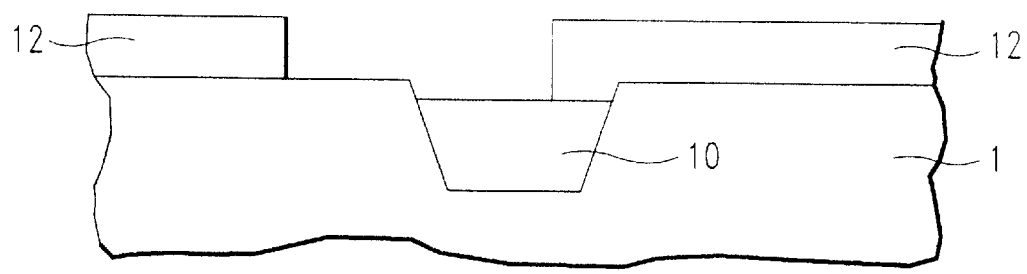
Figure 3:
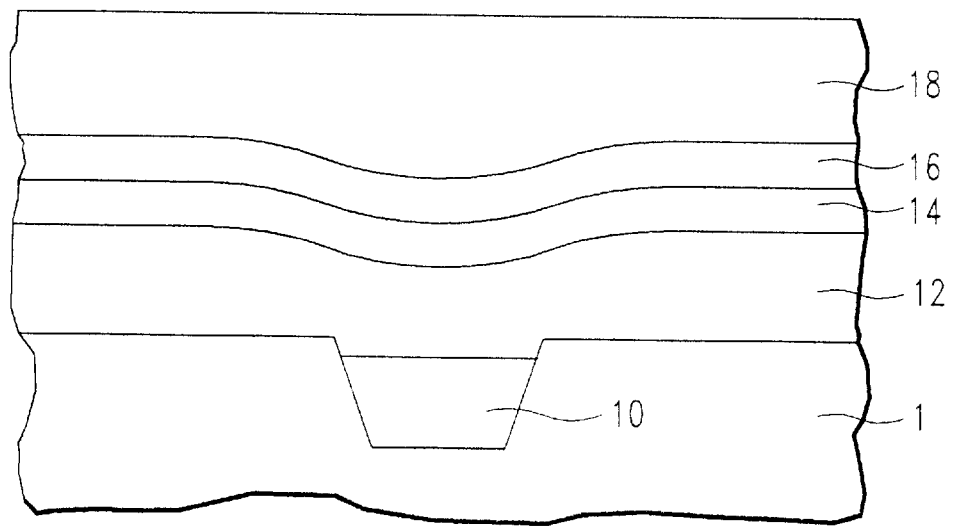
FIG. 3 is a schematic diagram of a structure for forming a pattern in a substrate according to the process of the present invention.

Next, the photoresist 18 may be developed. In developing the photoresist, depending on whether positive or negative photoresist is used, either the exposed or the unexposed portion respectively of the photoresist will be removed. Any known process may be used to remove this photoresist. For example, a compound, such as the solvent PGMEA, may be used in developing the photoresist which results in removing the desired portion of the photoresist (see FIG. 2A).

As the selected portion of the photoresist is removed, the underlying anti-reflective coating is exposed. The exposed portion of the anti-reflective coating is then removed. In the case of silicon oxynitride, such can be removed using reactive ion etching employing $CHF_3/O_2$ or aqueous $H_3PO_4$ etchant composition. In the case of removing the silicon oxynitride by $H_3PO_4$, it is preferred that the process be carried out in a quartz lined tank in order to enhance the selectivity to the underlying silicon oxide. The exposed portions of the underlying hard mask is then removed by etching.

It is crucial to the success of the present invention that after patterning the hard mask, both the remaining photoresist layer 18 and anti-reflective coating 16 be removed to allow for silicidization of the underlying polysilicon film. The photoresist can be removed by ozone or oxygen plasma. The anti-reflective coating in the case of silicon oxynitride can be removed by reactive ion etching or $H_3PO_4$ as discussed above or by downstream plasma etching. Removal of the photoresist 18 and anti-reflective coating 16 at this stage of the process avoids disrupting the poly gate structure material, any diffusions and the shallow trench isolation since such are still protected by the layer 12 underlying the patterned hard mask 14 as well as the remaining portions of the hard mask 14.

Figure 4A:
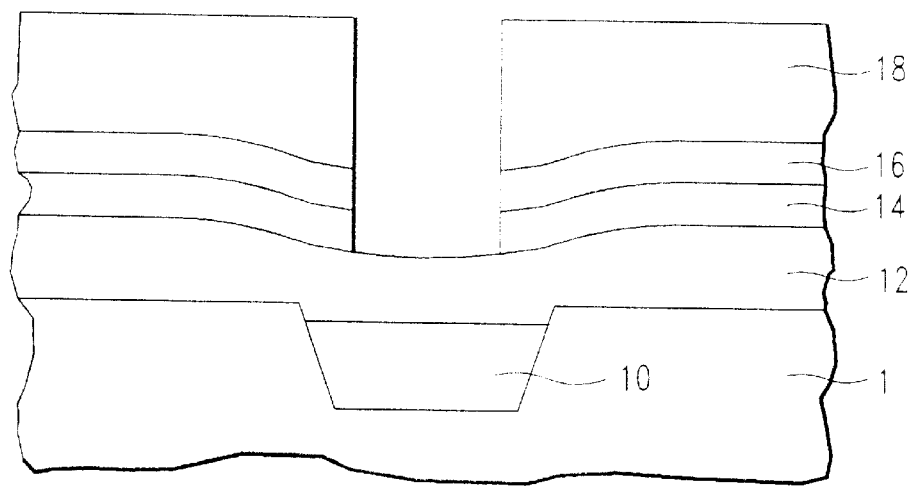
FIGS. 4A–4B are schematic diagrams of a sequence according to the present invention for providing the pattern in a substrate.
Figure 4B:
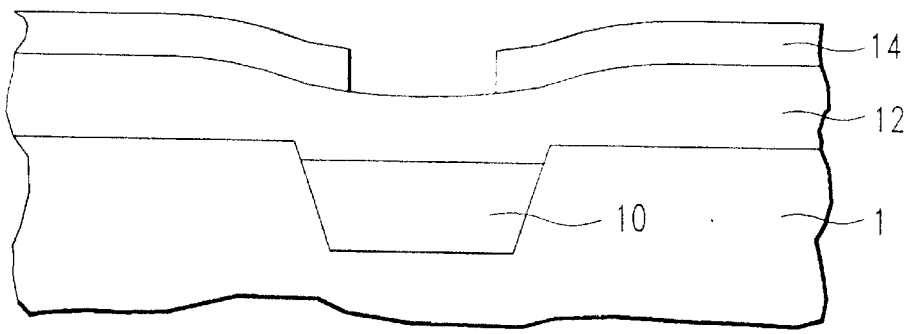
Figure 4C:
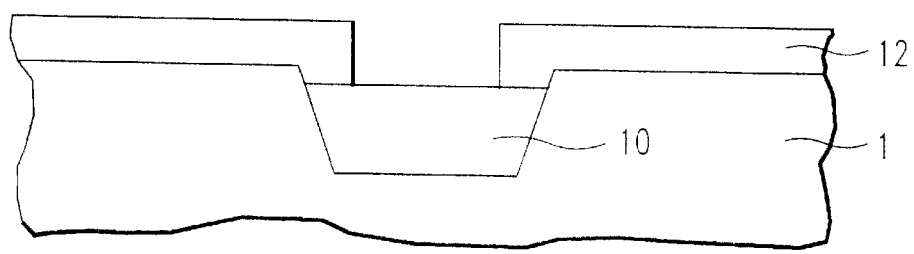

The hard mask 14 is then used as the etch mask for etching the underlying surface such as a polysilicon surface in the case of preferred structures according to the present invention. The polysilicon can be etched by reactive ion etching using $HBR/Cl/He/O_2$. This creates the gate structure. The hard mask 14 can then be removed such as by employing the above-described HF and chlorine etchant composition or by reactive ion etching using $CHF_3$ (see FIG. 4C).

Figure 5:
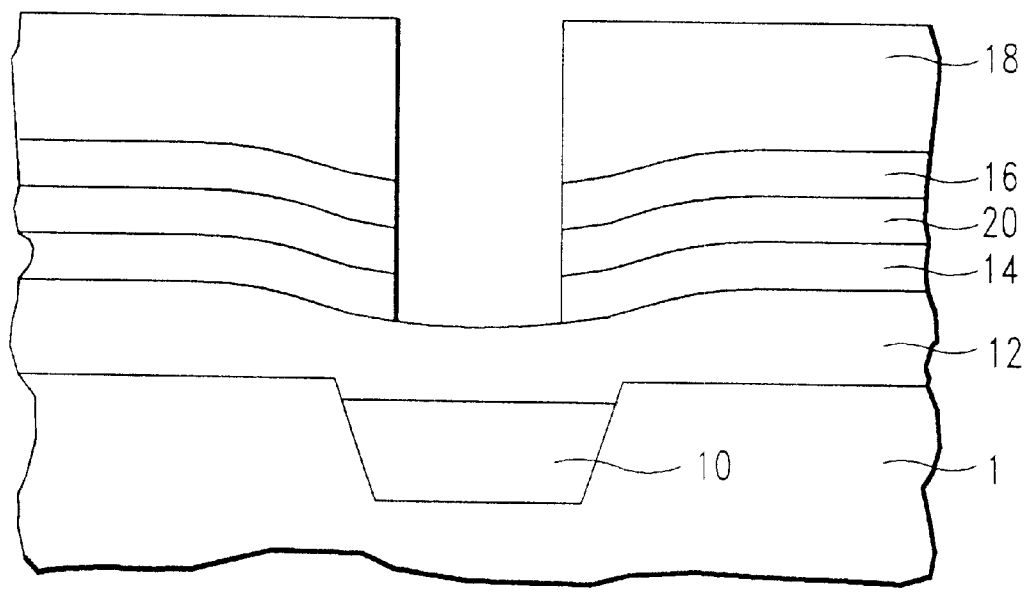
FIG. 5 is a schematic diagram of an alternative embodiment of a structure according to the present invention.

Reference to FIG. 5 illustrates an alternative embodiment according to the present invention whereby an amorphous silicon layer 20 is deposited between the hard mask layer 14 and anti-reflective coating 16. Such is typically deposited by sputtering or by PECVD. The presence of the amorphous silicon layer 20 makes it easier to remove the anti-reflective coating by a reactive ion etching process since such is more selective to silicon than it is to the silicon oxide obtained from TEOS. Typically, this silicon layer is about 100 Å to about 5000 Å thick.

Reference to FIG. 6 illustrates the advantage of using an inorganic ARC as compared to an organic ARC in the present invention. FIG. 6 is a resist swing curve measuring feature width versus function of resist thicknesses. Curve A is for the organic ARC and curve B for the inorganic ARC. As apparent, the inorganic ARC minimizes feature changes with varying resist thickness.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for defining a pattern in a surface which comprises:

providing on said surface a layer of hard mask material;

depositing an inorganic anti-reflective coating on said layer of hard mask material;

applying a photoresist layer above said anti-reflective coating;

patterning said photoresist layer;

patterning said antireflective coating;

patterning said layer of hard mask material;

removing the remaining portions of said photoresist layer;

removing the remaining portions of said anti-reflective layer by etching the remaining portions thereof; and then patterning said surface using the hard mask as a mask.

2. The process of claim 1 wherein said layer of hard mask material is provided by reacting tetraethylorthosilicate with oxygen or ozone to provide silicon dioxide.

3. The process of claim 1 wherein said layer of hard mask material is about 400 to about 1000 Å thick.

4. The process of claim 1 wherein said anti-reflective coating is a conformal inorganic coating.

5. The process of claim 1 wherein said anti-reflective coating is a conformably deposited silicon oxynitride.

6. The process of claim 5 wherein said silicon oxynitride is deposited by chemical vapor deposition.

7. The method of claim 6 wherein the top surface of said silicon oxynitride is oxidized, or a further oxide layer is deposited.

8. The process of claim 6 wherein the top surface of said silicon oxynitride is oxidized by a $N_2O$ plasma treatment.

9. The process of claim 6 wherein said anti-reflective coating has a thickness of about 100 to about 2000 Å.

10. The process of claim 1 wherein said photoresist layer is a chemically amplified photoresist.

11. The process of claim 10 wherein said photoresist layer is about 3000 to about 15000 Å thick.

12. The process of claim 1 wherein said anti-reflective coating is patterned by reactive ion etching or wet etching employing $H_2PO_4$ aqueous etchant composition or downstream plasma etching.

13. The process of claim 5 wherein said hard mask material is silicon oxide from reacting tetraethylorthosilicate with oxygen or ozone and wherein said hard mask material is etched and removed employing an aqueous composition containing HF.

14. The process of claim 1 wherein said hard mask comprises a layer of silicon oxide from tetraethylorthosilicate reacted with ozone or oxygen and an upper layer of amorphous silicon.

15. The process of claim 14 wherein said amorphous silicon is about 100 to about 500 Å thick.

16. The process of claim 1 wherein said surface is polycrystalline silicon.

17. The process of claim 16 wherein a gate oxide is present beneath the polycrystalline silicon the locations where patterned followed by a semiconductor substrate.

18. The process of claim 1 wherein said semiconductor substrate includes non-planar topology.

* * * * *

UNITED STATES PATENT AND TRADEMARK OFFICE
CERTIFICATE OF CORRECTION

PATENT NO. : 6,030,541
DATED : Feb. 29, 2000
INVENTOR(S): James W. Adkisson et al.

It is certified that error appears in the above–identified patent and that said Letters Patent is hereby corrected as shown below:

Claim 9, line 1, delete "6" and insert ---5---.

Signed and Sealed this

Tenth Day of April, 2001

Attest:

NICHOLAS P. GODICI

Attesting Officer     Acting Director of the United States Patent and Trademark Office